(12) United States Patent
Mori et al.

(10) Patent No.: US 9,190,344 B2
(45) Date of Patent: Nov. 17, 2015

(54) LIQUID-COOLED-TYPE COOLING DEVICE

(75) Inventors: Shogo Mori, Kariya (JP); Hideyasu Obara, Kariya (JP); Taizo Kuribayashi, Oyama (JP); Shinobu Tamura, Oyama (JP)

(73) Assignees: KABUSHIKI KAISHA TOYOTA JIDOSHOKKI, Kariya-shi (JP); SHOWA DENKO K.K., Tokyo (JP)

( * ) Notice: Subject to any disclaimer, the term of this patent is extended or adjusted under 35 U.S.C. 154(b) by 1269 days.

(21) Appl. No.: 12/740,024

(22) PCT Filed: Nov. 25, 2008

(86) PCT No.: PCT/JP2008/071304
§ 371 (c)(1),
(2), (4) Date: Apr. 27, 2010

(87) PCT Pub. No.: WO2009/069578
PCT Pub. Date: Jun. 4, 2009

(65) Prior Publication Data
US 2010/0252235 A1    Oct. 7, 2010

(30) Foreign Application Priority Data
Nov. 26, 2007    (JP) .................................. 2007-303970

(51) Int. Cl.
*F28F 7/00*    (2006.01)
*F28D 15/00*    (2006.01)
(Continued)

(52) U.S. Cl.
CPC ....... *H01L 23/473* (2013.01); *H01L 2924/0002* (2013.01)

(58) Field of Classification Search
CPC ..................... H01L 23/473; H01L 2924/0002; H01L 25/072; H05K 7/20254; F28F 3/00
USPC .............. 165/80.4, 104.19, 104.33, 168–170, 165/181
See application file for complete search history.

(56) References Cited

U.S. PATENT DOCUMENTS 2,934,322 A * 4/1960 Hazard .......................... 165/147
RE27,100 E * 3/1971 De Wall .......................... 422/46
(Continued)

FOREIGN PATENT DOCUMENTS

CN    1812182 A    8/2006
CN    1942088 A    4/2007
(Continued)

OTHER PUBLICATIONS

U.S. Appl. No. 12/911,357, filed Oct. 25, 2010, Mori, et al.
(Continued)

*Primary Examiner* — Frantz Jules
*Assistant Examiner* — Claire Rojohn, III
(74) *Attorney, Agent, or Firm* — Oblon, McClelland, Maier & Neustadt, L.L.P.

(57) ABSTRACT

A casing of a liquid-cooled-type cooling device has a peripheral wall including mutually facing right and left side walls. A cooling-liquid inlet is formed at one end of the right side wall, and a cooling-liquid outlet is formed at an end of the left side wall corresponding to the other end of the right side wall. A parallel-flow-channel section is provided within the casing to be located between the left and right side walls and between the cooling-liquid inlet and outlet and includes flow channels through which cooling liquid flows. Internal regions of the casing located upstream and downstream of the parallel-flow-channel section serve as inlet and outlet header sections, respectively. The cross-sectional area of the inlet header section reduces from the cooling-liquid inlet toward the left side wall. The outlet and inlet header sections are asymmetric in shape with respect to the width direction of the parallel-flow-channel section.

12 Claims, 4 Drawing Sheets

(51) Int. Cl.
  *F28F 3/12* (2006.01)
  *H01L 23/473* (2006.01)

(56) References Cited

U.S. PATENT DOCUMENTS

| | | | |
|---|---|---|---|
| 4,099,559 A * | 7/1978 | Butt | 165/170 |
| 4,122,828 A * | 10/1978 | DiPeri | 126/671 |
| 4,765,397 A * | 8/1988 | Chrysler et al. | 165/104.33 |
| 5,225,161 A * | 7/1993 | Mathewson et al. | 422/46 |
| 5,631,821 A * | 5/1997 | Muso | 363/141 |
| 5,959,351 A * | 9/1999 | Sasaki et al. | 257/714 |
| 6,101,715 A * | 8/2000 | Fuesser et al. | 29/890.03 |
| 6,508,301 B2 * | 1/2003 | Marsala | 165/80.4 |
| 6,951,110 B2 * | 10/2005 | Kang | 60/772 |
| 7,569,957 B2 * | 8/2009 | Aoki et al. | 310/64 |
| 8,933,557 B2 * | 1/2015 | Gohara et al. | 257/706 |
| 2005/0139996 A1* | 6/2005 | Myers et al. | 257/712 |
| 2006/0070717 A1* | 4/2006 | Noel | 165/46 |
| 2006/0093901 A1 | 5/2006 | Lee et al. | |
| 2006/0219388 A1* | 10/2006 | Terakado et al. | 165/80.4 |
| 2006/0225867 A1* | 10/2006 | Park et al. | 165/80.4 |
| 2007/0070603 A1 | 3/2007 | Park et al. | |
| 2009/0178792 A1 | 7/2009 | Mori et al. | |
| 2009/0314474 A1 | 12/2009 | Kimbara et al. | |
| 2010/0051234 A1 | 3/2010 | Mori et al. | |
| 2010/0051235 A1 | 3/2010 | Mori et al. | |
| 2010/0090336 A1* | 4/2010 | Yoshida et al. | 257/717 |
| 2010/0172091 A1* | 7/2010 | Nishiura | 361/689 |
| 2013/0058041 A1* | 3/2013 | Gohara et al. | 361/699 |
| 2013/0228322 A1* | 9/2013 | Yasuda et al. | 165/185 |
| 2014/0043765 A1* | 2/2014 | Gohara et al. | 361/699 |
| 2014/0233602 A1* | 8/2014 | Kitazawa | 374/45 |
| 2014/0239486 A1* | 8/2014 | Gohara et al. | 257/714 |

FOREIGN PATENT DOCUMENTS

| | | |
|---|---|---|
| JP | 7 194139 | 7/1995 |
| JP | 8 293573 | 11/1996 |
| JP | 2001-352025 | 12/2001 |
| JP | 2001 352025 | 12/2001 |
| JP | 2004-295718 | 10/2004 |
| JP | 2004 295718 | 10/2004 |
| JP | 2006 286767 | 10/2006 |
| JP | 2006-295178 | 10/2006 |
| WO | 2006 118032 | 11/2006 |

OTHER PUBLICATIONS

Office Action issued on Sep. 7, 2011 in the corresponding Chinese Patent Application No. 200880116918.5.

* cited by examiner

LIQUID-COOLED-TYPE COOLING DEVICE

TECHNICAL FIELD

The present invention relates to a liquid-cooled-type cooling device which is applied to, for example, a semiconductor power converter of a vehicle for cooling a heat-generating body, such as a semiconductor device.

In the present specification and appended claims, the term "width of a parallel-flow-channel section" means the width of the parallel-flow-channel section as measured in a direction perpendicular to the longitudinal direction of flow channels provided in the parallel-flow-channel section, and the terms "width of an inflow end portion of an inlet header section" and "width of an outlet header section" mean width as measured in the longitudinal direction of flow channels provided in the parallel-flow-channel section.

BACKGROUND ART

A conventionally known liquid-cooled-type cooling device of this type has a casing which, in turn, has a peripheral wall. The peripheral wall includes a first side wall and a second side wall positioned in opposition to each other. A cooling-liquid inlet is formed at one end portion of the first side wall, and a cooling-liquid outlet is formed at an end portion of the second side wall corresponding to the other end portion of the first side wall. In the casing, a parallel-flow-channel section is provided in an internal region located between the first side wall and the second side wall and between the cooling-liquid inlet and the cooling-liquid outlet. The parallel-flow-channel section includes a plurality of flow channels through which cooling liquid flows in the longitudinal direction of the first and second side walls. An internal region of the casing located upstream of the parallel-flow-channel section serves as an inlet header section communicating with the cooling-liquid inlet. An internal region of the casing located downstream of the parallel-flow-channel section serves as an outlet header section communicating with the cooling-liquid outlet. The inlet header section and the outlet header section have a rectangular cross section. Each of the inlet header section and the outlet header section has a uniform width along its overall length.

In the above-mentioned liquid-cooled-type cooling device, when the ratio of the width of the inlet header section and that of the outlet header section to the width of the parallel-flow-channel section is rendered sufficiently high, the distribution of flow velocities along the width of the parallel-flow-channel section becomes uniform, so that sufficient cooling performance is ensured.

However, recently, a reduction in the size of a liquid-cooled-type cooling device has been demanded. For this reason, the above-mentioned liquid-cooled-type cooling device encounters difficulty in having a sufficiently high ratio of the width of the inlet header section and that of the outlet header section to the width of the parallel-flow-channel section. As a result, the distribution of flow velocities along the direction of width of the parallel-flow-channel section becomes nonuniform, raising a problem of deterioration in cooling performance in a region of the parallel-flow-channel section where the flow velocity drops.

In order to solve the above-mentioned problem, Patent Document 1 proposes a liquid-cooled-type cooling device having a casing configured in the following manner. The casing has a peripheral wall including a first side wall and a second side wall positioned in opposition to each other. A cooling-liquid inlet is formed at one end portion of the first side wall, and a cooling-liquid outlet is formed at an end portion of the second side wall corresponding to the other end portion of the first side wall. In the casing, a parallel-flow-channel section is provided in an internal region located between the first side wall and the second side wall and between the cooling-liquid inlet and the cooling-liquid outlet. The parallel-flow-channel section includes a plurality of flow channels through which cooling liquid flows in the longitudinal direction of the first and second side walls. An internal region of the casing located upstream of the parallel-flow-channel section serves as an inlet header section communicating with the cooling-liquid inlet. An internal region of the casing located downstream of the parallel-flow-channel section serves as an outlet header section communicating with the cooling-liquid outlet. The cross-sectional flow-channel area of the inlet header section reduces in a direction from a side toward the cooling liquid inlet to a side toward the second side wall. The cross-sectional flow-channel area of the outlet header section reduces in a direction from a side toward the cooling-liquid outlet to a side toward the first side wall. The shape of the inlet header section and the shape of the outlet header section are symmetrical to each other with respect to the direction of width of the parallel-flow-channel section.

However, even in the liquid-cooled-type cooling device described in Patent Document 1, the distribution of flow velocities of all the flow channels is not sufficiently uniform. As a result, there arises a region of the parallel-flow-channel section where the flow velocity drops, and cooling performance in the region deteriorates. Furthermore, flow resistance may possibly increase.

Patent Document 1:

Japanese Patent Application Laid-Open (kokai) No. 2006-295178

DISCLOSURE OF THE INVENTION

Problems to be Solved by the Invention

An object of the present invention is to solve the above-mentioned problems and to provide a liquid-cooled-type cooling device whose parallel-flow-channel section including a plurality of flow channels arranged in parallel with one another exhibits a uniform distribution of flow velocities along the direction of width of the parallel-flow-channel section.

Means for Solving the Problems

To achieve the above object, the present invention comprises the following modes.

1) A liquid-cooled-type cooling device has a casing which has a peripheral wall including a first side wall and a second side wall positioned in opposition to each other. A cooling-liquid inlet is formed at one end portion of the first side wall, and a cooling-liquid outlet is formed at an end portion of the second side wall corresponding to the other end portion of the first side wall. In the casing, a parallel-flow-channel section is provided in an internal region located between the first side wall and the second side wall and between the cooling-liquid inlet and the cooling-liquid outlet and includes a plurality of flow channels through which cooling liquid flows in a longitudinal direction of the first and second side walls. An internal region of the casing located upstream of the parallel-flow-channel section serves as an inlet header section communicating with the cooling-liquid inlet. An internal region of the casing located downstream of the parallel-flow-channel section serves as an outlet header section communicating with the cooling-liquid outlet.

The cross-sectional flow-channel area of the inlet header section reduces in a direction from a side toward the cooling-liquid inlet to a side toward the second side wall.

The shape of the outlet header section is not symmetrical with that of the inlet header section with respect to the direction of width of the parallel-flow-channel section.

2) A liquid-cooled-type cooling device according to par. 1), wherein a portion of the outlet header section which portion extends from the first side wall reduces in cross-sectional flow-channel area in a direction from the side toward the second side wall to a side toward the first side wall, and the remaining portion of the outlet header section is uniform in cross-sectional flow-channel area along the entire length of the remaining portion.

3) A liquid-cooled-type cooling device according to par. 2), wherein the inlet header section, the outlet header section, and the parallel-flow-channel section have the same height.

4) A liquid-cooled-type cooling device according to par. 3), wherein the peripheral wall of the casing further includes a third side wall connecting an end portion of the first side wall located on a side toward the cooling-liquid inlet and an end portion of the second side wall located on the side toward the cooling-liquid inlet, and a fourth side wall connecting an end portion of the first side wall located on a side toward the cooling-liquid outlet and an end portion of the second side wall located on the side toward the cooling-liquid outlet, and an inner surface of the third side wall is skewed toward the parallel-flow-channel section in a direction from the side toward the first side wall to the side toward the second side wall.

5) A liquid-cooled-type cooling device according to par. 4), wherein in the portion of the outlet header section which portion extends from the first side wall, an inner surface of the fourth side wall is skewed toward the parallel-flow-channel section in a direction from the side toward the second side wall to the side toward the first side wall, and in the remaining portion of the outlet header section, an inner surface of the fourth side wall is perpendicular to inner surfaces of the first and second side walls.

6) A liquid-cooled-type cooling device according to par. 4), wherein a relation $a/b \leq 0.15$ is satisfied on the condition that the inflow end portion of the inlet header section has a width of a mm, the portion of the outlet header section in which the inner surface of the fourth side wall is perpendicular to the inner surfaces of the first and second side walls has a width of a mm, the parallel-flow-channel section has a width of b mm, and the inlet header section, the outlet header section, and the parallel-flow-channel section have a height of 6 mm or less.

7) A liquid-cooled-type cooling device according to par. 1), wherein the outlet header section is uniform in cross-sectional flow-channel area along the entire length of the outlet header section.

8) A liquid-cooled-type cooling device according to par. 7), wherein the inlet header section, the outlet header section, and the parallel-flow-channel section have the same height, and the outlet header section is uniform in width along the entire length of the outlet header section.

9) A liquid-cooled-type cooling device according to par. 8), wherein the peripheral wall of the casing further includes a third side wall connecting an end portion of the first side wall located on a side toward the cooling-liquid inlet and an end portion of the second side wall located on the side toward the cooling-liquid inlet, and a fourth side wall connecting an end portion of the first side wall located on a side toward the cooling-liquid outlet and an end portion of the second side wall located on the side toward the cooling-liquid outlet, and an inner surface of the third side wall is skewed toward the parallel-flow-channel section in a direction from the side toward the first side wall to the side toward the second side wall.

10) A liquid-cooled-type cooling device according to par. 7), wherein a relation $a/b \leq 0.15$ is satisfied on the condition that the inflow end portion of the inlet header section has a width of a mm, the outlet header section has a width of a mm, the parallel-flow-channel section has a width of b mm, and the inlet header section, the outlet header section, and the parallel-flow-channel section have a height of 6 mm or less.

11) A liquid-cooled-type cooling device according to par. 2) or 7), wherein a cross-sectional area A of the inflow end portion of the inlet header section as expressed by a×h and a cross-sectional area B of the parallel-flow-channel section as expressed by b×h satisfy a relation $A/B \leq 0.15$ on the condition that the inflow end portion of the inlet header section has a height of h mm and a width of a mm, and the parallel-flow-channel section has a height of h mm and a width of b mm.

12) A liquid-cooled-type cooling device comprising:
a casing including a bottom wall, a first side wall vertically extending from the bottom wall, a second side wall vertically extending from the bottom wall and facing the first side wall, a top wall facing the bottom wall and connected to the first and second side walls, a third side wall which connects the bottom wall and the top wall and whose one end is connected to one end of the second side wall, a fourth side wall which connects the bottom wall and the top wall and whose one end is connected to one end of the first side wall, a cooling-liquid inlet which connects the other end of the first side wall and the other end of the third side wall, and a cooling-liquid outlet which connects the other end of the second side wall and the other end of the fourth side wall, wherein the third side wall and the fourth side wall differ in shape; and
a parallel-flow-channel section provided within the casing and including a plurality of flow channels through which cooling liquid flows in a longitudinal direction of the first and second side walls.

13) A liquid-cooled-type cooling device according to par. 12), wherein, as the distance from the first side wall increases, the distance between a shortest imaginary line and a portion of the fourth side wall which portion extends from the first side wall increases, the shortest imaginary line connecting the one end of the first side wall and the other end of the second side wall, and the remaining portion of the fourth side wall is in parallel with the shortest imaginary line.

14) A liquid-cooled-type cooling device according to par. 13), wherein, as the distance from the second side wall increases, a distance between a shortest imaginary line and the third side wall increases, the shortest imaginary line connecting the other end of the first side wall and the one end of the second side wall.

Effects of the Invention

According to the liquid-cooled-type cooling device of any one of pars. 1) to 14), the cross-sectional flow-channel area of the inlet header section reduces in a direction from the side toward the cooling-liquid inlet to the side toward the second side wall, and the shape of the outlet header section is not symmetrical with that of the inlet header section with respect to the direction of width of the parallel-flow-channel section. This configurational feature can render uniform the distribution of flow velocities along the direction of width of the parallel-flow-channel section, in which a plurality of flow channels are formed in parallel with one another. Accordingly, there can be prevented the occurrence of a region in which cooling performance deteriorates, which could otherwise result from drop in flow velocity. Furthermore, an increase in flow resistance can be prevented.

According to the liquid-cooled-type cooling device of par. 5), there can be prevented the generation of vortexes in an end portion of the outlet header section located on the side toward the first side wall, thereby preventing backward flow of cooling liquid into the parallel-flow-channel section.

According to the liquid-cooled-type cooling device of any one of pars. 6), 10), and 11), the distribution of flow velocities along the direction of width of the parallel-flow-channel section, in which a plurality of flow channels are formed in parallel with one another, can be rendered uniform more effectively. Accordingly, there can be reliably prevented the occurrence of a region in which cooling performance deteriorates, which could otherwise result from drop in flow velocity. Furthermore, an increase in flow resistance can be prevented.

BEST MODE FOR CARRYING OUT THE INVENTION

Embodiments of the present invention will next be described in detail with reference to the drawings.

In the following description, the upper, lower, left-hand, and right-hand sides of FIG. 2 will be referred to as "upper," "lower," "left," and "right," respectively. Further, the lower and upper sides of FIGS. 3 and 7 will be referred to as "front" and "rear," respectively.

In the following description, the term "aluminum" encompasses aluminum alloys in addition to pure aluminum.
Embodiment 1:

The present embodiment is shown in FIGS. 1 to 4.

FIGS. 1 to 4 show a state in which a semiconductor device, which is a heat-generating body, is mounted on a liquid-cooled-type cooling device according to Embodiment 1 of the present invention.

In FIGS. 1 to 4, a liquid-cooled-type cooling device 1 has a casing 2 which includes a top wall 3, a bottom wall 4, and a peripheral wall 5. The peripheral wall 5 of the casing 2 includes a right side wall 6 (first side wall), which extends in the front-rear direction and stands vertically; a left side wall 7 (second side wall), which extends in the front-rear direction, stands vertically, and is positioned in opposition to the right side wall 6; a rear side wall 8 (third side wall), which connects rear end portions of the right and left side walls 6 and 7 and stands vertically; and a front side wall 9 (fourth side wall), which connects front end portions of the right and left side walls 6 and 7 and stands vertically. In the peripheral wall 5 of the casing 2, a cooling-liquid inlet 11 is formed at a rear end portion of the right side wall 6 in a rightward projecting condition, and a cooling-liquid outlet 12 is formed at a front end portion of the left side wall 7 in a leftward projecting condition. The cooling-liquid inlet 11 opens rightward, whereas the cooling-liquid outlet 12 opens leftward. That is, the cooling-liquid inlet 11 connects the rear end portion (the other end) of the right side wall 6 and the end portion (the other end) of the rear side wall 8 located on the side toward the right side wall 6, and the cooling-liquid outlet 12 connects the front end portion (the other end) of the left side wall 7 and the end portion (the other end) of the front side wall 9 located on the side toward the left side wall 7. The casing 2 is formed of an upper structure member 13 of aluminum and a lower structure member 14 of aluminum. The upper structure member 13 includes the top wall 3 and an upper peripheral-wall- formation section 5A, which serves as an upper half of the peripheral wall 5. The lower structure member 14 includes the bottom wall 4 and a lower peripheral-wall-formation section 5B, which serves as a lower half of the peripheral wall 5. A lower end portion of the upper peripheral-wall-formation section 5A of the upper structure member 13 and an upper end portion of the lower peripheral-wall-formation section 5B of the lower structure member 14 have integrally formed outward flanges 15 and 16, respectively. The outward flanges 15 and 16 of the upper and lower structure members 13 and 14 are brazed together.

An aluminum corrugated fin 17 is disposed in an internal region of the casing 2 located between the right side wall 6 and the left side wall 7 and between the cooling-liquid inlet 11 and the cooling-liquid outlet 12. The corrugated fin 17 includes wave crest portions 17a, wave trough portions 17b, and vertical connection portions 17c each connecting the wave crest portion 17a and the wave trough portion 17b. The wave crest portions 17a are brazed to the top wall 3 of the casing 2, whereas the wave trough portions 17b are brazed to the bottom wall 4 of the casing 2. The corrugated fin 17 forms a plurality of flow channels 18 which extend in the front-rear direction and are arranged in the left-right direction and through which cooling liquid flows in the front-rear direction (longitudinal direction of the right and left walls 6 and 7), thereby providing a parallel-flow-channel section 19 including a plurality of flow channels.

An internal region of the casing 2 located upstream (rearward) of the parallel-flow-channel section 19 serves as an inlet header section 21 communicating with the cooling-liquid inlet 11. An internal region of the casing 2 located downstream (frontward) of the parallel-flow-channel section 19 serves as an outlet header section 22 communicating with the cooling-liquid outlet 12. The internal height of the entire casing 2 is uniform; i.e., the inlet header section 21, the outlet header section 22, and the parallel-flow-channel section 19 have the same height. The entire rear side wall 8 of the casing 2; specifically, the inner surface of the rear side wall 8, is smoothly skewed frontward (toward the parallel-flow-channel section 19) in a direction from the side toward the right side wall 6 to the side toward the left side wall 7. As a result, the cross-sectional flow-channel area of the inlet header section 21 reduces in a direction from the side toward the cooling-liquid inlet 11 to the side toward the left side wall 7. That is, as the distance from the left side wall 7 increases, the distance between the rear side wall 8 and a shortest imaginary line increases, the shortest imaginary line connecting the rear end portion (the other end) of the right side wall 6 and the rear end portion (one end) of the left side wall 7. Also, in a portion of the outlet header section 22 which extends from the right side wall 6 toward the left side wall 7 and whose length is 20% or less that of the outlet header section 22, the entire front side wall 9; specifically, the inner surface of the front side wall 9, is skewed rearward (toward the parallel-flow-channel section 19) in a direction from the side toward the left side wall 7 to the side toward the right side wall 6. In the remaining portion of the outlet header section 22, the entire front side wall 9; specifically, the inner surface of the front side wall 9, is perpendicular to the inner surfaces of the right and left side walls 6 and 7. As a result, a portion of the outlet header section 22 which extends from the right side wall 6 of the casing 2; for example, a portion of the outlet header section 22 which extends from the right side wall 6 and whose length is 20% or less that of the outlet header section 22, reduces in cross-sectional flow-channel area in a direction from the side toward the left side wall 7 to the side toward the right side wall 6, whereas the remaining portion of the outlet header section 22 is uniform in cross-sectional flow-channel area along the entire length of the remaining portion. That is, as the distance from the right side wall 6 increases, the distance between a portion of the front side wall 9 and a shortest imaginary line increases, the shortest imaginary line connecting the front end portion (one end) of the right side wall 6 and the front end portion (the other end) of the left side wall 7, and the remaining portion of the front side wall 9 is in parallel with the shortest imaginary line, which connects the front end portion (one end) of the right side wall 6 and the front end portion (the other end) of the left side wall 7. Also, the shape of the outlet header section 22 is not symmetrical with that of the inlet header section 21 with respect to the left-right direction (the direction of width of the parallel-flow-channel section 19). That is, the shape of the rear side wall 8 differs from that of the front side wall 9.

As shown in FIG. 4, an inflow end portion 21a of the inlet header section 21 which communicates with the cooling-liquid inlet 11 and is located on the side toward the right side wall 6 has a rectangular cross section. Also, a portion of the outlet header section 22 in which the inner surface of the front side wall 9 is perpendicular to the inner surfaces of the right and left side walls 6 and 7 has a rectangular cross section. The inflow end portion 21a of the inlet header section 21 and the portion of the outlet header section 22 in which the inner surface of the front side wall 9 is perpendicular to the inner surfaces of the right and left side walls 6 and 7 have the same width (width in the front-rear direction). As shown in FIG. 2, the parallel-flow-channel section 19 has a rectangular cross section. Preferably, the relation a/b≤0.15 is satisfied on the condition that the inflow end portion 21a of the inlet header section 21 has a width of a mm, the portion of the outlet header section 22 in which the inner surface of the front side wall 9 is perpendicular to the inner surfaces of the right and left side walls 6 and 7 has a width of a mm, the parallel-flow-channel section 19 has a width (width in the left-right direction) of b mm, and the inlet header section 21, the outlet header section 22, and the parallel-flow-channel section 19 have a height of 6 mm or less.

Also, preferably, a cross-sectional area A of the inflow end portion 21a of the inlet header section 21 as expressed by a×h and a cross-sectional area B of the parallel-flow-channel section 19 as expressed by b×h satisfy the relation A/B≤0.15 on the condition that the inflow end portion 21a of the inlet header section 21 has a height of h mm and a width of a mm, and the parallel-flow-channel section 19 has a height of h mm and a width of b mm.

A semiconductor device P, which is a heat-generating body, is joined to the outer surface of the top wall 3 of the casing 2 via a plate-like insulating member I.

In the liquid-cooled-type cooling device 1 having the above-described configuration, a cooling liquid introduced from the cooling-liquid inlet 11 passes through the inflow end portion 21a and flows into the inlet header section 21. The cooling liquid flows into all of the flow channels 18 of the parallel-flow-channel section 19 in a uniformly divided condition and flows frontward through the flow channels 18. At this time, since the entire rear side wall 8 of the casing 2; specifically, the inner surface of the rear side wall 8, is smoothly skewed frontward in a direction from the side toward the right side wall 6 to the side toward the left side wall 7, and thus the cross-sectional flow-channel area of the inlet header section 21 reduces in a direction from the side toward the cooling-liquid inlet 11 to the side toward the left side wall 7, the distribution of flow velocities in all the flow channels 18 of the parallel-flow-channel section 19; i.e., the distribution of flow velocities along the direction of width of the parallel-flow-channel section 19 becomes uniform.

The cooling liquid which has flowed frontward through the flow channels 18 of the parallel-flow-channel section 19 enters the outlet header section 22; flows leftward through the outlet header section 22; passes through an outflow end portion 22a of the outlet header section 22 which is located on the side toward the left side wall 7; and flows out from the cooling-liquid outlet 12. Since, in a portion of the outlet header section 22 which extends from the right side wall 6 toward the left side wall 7 and whose length is 20% or less that of the outlet header section 22, the entire front side wall 9; specifically, the inner surface of the front side wall 9, is skewed rearward in a direction from the side toward the left side wall 7 to the side toward the right side wall 6, there can be prevented the generation of vortexes in a right end portion of the outlet header section 22, thereby preventing backward flow of the cooling liquid into the flow channels 18 of the parallel-flow-channel section 19 from the outlet header section 22.

Heat generated from the semiconductor device P is transmitted to the cooling liquid which flows through the flow channels 18, via the insulating member I, the top wall 3 of the casing 2, and the corrugated fin 17. The semiconductor device P thus is cooled.

Next, experiments and comparative experiments which were conducted by use of the liquid-cooled-type cooling device 1 of Embodiment 1 will be described by way of example.

Experiment Example 1

There were prepared a plurality of liquid-cooled-type cooling devices 1 each having a configuration similar to that of the liquid-cooled-type cooling device 1 of Embodiment 1. The plurality of liquid-cooled-type cooling devices 1 differ from one another in a/b in a range of 0.15 or less on the condition that the inflow end portion 21a of the inlet header section 21, the outlet header section 22, and the parallel-flow-channel section 19 have a height of 6 mm, the inflow end portion 21a of the inlet header section 21 has a width of a mm, a portion of the outlet header section 22 in which the inner surface of the front side wall 9 is perpendicular to the inner surfaces of the right and left side walls 6 and 7 has a width of a mm, and the parallel-flow-channel section 19 has a width of b mm. In each of the liquid-cooled-type cooling devices 1, in a portion of the outlet header section 22 which extends from the right side wall 6 toward the left side wall 7 and whose length is 20% that of the outlet header section 22, the entire front side wall 9 is skewed rearward in a direction from the side toward the left side wall 7 to the side toward the right side wall 6.

In each of the liquid-cooled-type cooling devices 1, water was supplied into the inlet header section 21 from the cooling-liquid inlet 11 through the inflow end portion 21a at a rate of 10 liters per minute. On the basis of flow velocities of water flowing through all the flow channels 18 of the parallel-flow-channel section 19, there were obtained the average flow velocity of all the flow channels 18 and the ratio of the flow velocity of water flowing through each flow channel 18 to the average flow velocity (flow velocity ratio=flow velocity/average flow velocity). By use of the obtained data, the relation between the aforementioned ratio a/b and the highest flow velocity ratio (=maximum flow velocity ratio) among the obtained flow velocity ratios was studied for each of the liquid-cooled-type cooling devices 1.

Comparative Experiment Example 1

There were prepared a plurality of liquid-cooled-type cooling devices each having a configuration similar to that of the liquid-cooled-type cooling device 1 of Embodiment 1 except that the inlet header section and the outlet header section were uniform in front-rear width along the entire length thereof. The plurality of liquid-cooled-type cooling devices differ from one another in a/b on the condition that the inlet header section, the outlet header section, and the parallel-flow-channel section have a height of 6 mm, an inflow end portion of the inlet header section; i.e., the inlet header section, and the outlet header section have a width of a mm, and the parallel-flow-channel section has a width of b mm.

In each of the liquid-cooled-type cooling devices, water was supplied into the inlet header section from the cooling-liquid inlet through the inflow end portion at a rate of 10 liters per minute. On the basis of flow velocities of water flowing through all the flow channels of the parallel-flow-channel section, there were obtained the average flow velocity of all the flow channels and the ratio of the flow velocity of water flowing through each flow channel to the average flow velocity (flow velocity ratio=flow velocity/average flow velocity). By use of the obtained data, the relation between the aforementioned ratio a/b and the highest flow velocity ratio (=maximum flow velocity ratio) among the obtained flow velocity ratios was studied for each of the liquid-cooled-type cooling devices 1.

The results of the study are shown in FIG. 5. As is apparent from FIG. 5, even though the liquid-cooled-type cooling devices 1 of Embodiment 1 used in Experiment Example 1 are low in the ratio of the front-rear width of the inflow end portion 21a of the inlet header section 21 and the front-rear width of the portion of the outlet header section 22 having the inner surface of the front side wall 9 perpendicular to the right and left side walls 6 and 7 to the width of the parallel-flow-channel section 19; specifically, even though the ratio a/b is 0.15 or less, the flow velocities of water flowing through the flow channels 18 are small in deviation from the average flow velocity. This indicates that the distribution of flow velocities of water flowing through all the flow channels 18 is uniform. Therefore, the dimension of the front-rear direction of the casing 2 can be reduced in relation to the width of the parallel-flow-channel section 19, whereby the size of the liquid-cooled-type cooling device 1 can be reduced.

By contrast, in the case of the liquid-cooled-type cooling devices which were used in Comparative Experiment Example 1 and in which the inlet header section and the outlet header section were uniform in width along the entire length thereof, with high a/b ratios, the flow velocities of water flowing through the flow channels are small in deviation from the average flow velocity. However, with a low a/b ratio of 0.15 or less, there exist some flow channels which exhibit a considerably large deviation from the average flow velocity, so that the distribution of flow velocities of water flowing through all the flow channels becomes nonuniform. Therefore, the dimension of the front-rear direction of the casing cannot be reduced in relation to the width of the parallel-flow-channel section; as a result, the size of the liquid-cooled-type cooling device increases.

Experiment Example 2

There was prepared a liquid-cooled-type cooling device 1 having a configuration similar to that of the liquid-cooled-type cooling device 1 of Embodiment 1. The liquid-cooled-type cooling device 1 has an a/b ratio of 0.07 on the condition that the inlet header section 21, the outlet header section 22, and the parallel-flow-channel section 19 have a height of 6 mm, the inflow end portion 21a of the inlet header section 21 has a width of a mm, a portion of the outlet header section 22 in which the inner surface of the front side wall 9 is perpendicular to the inner surfaces of the right and left side walls 6 and 7 has a width of a mm, and the parallel-flow-channel section 19 has a width of b mm. In the liquid-cooled-type cooling device 1, in a portion of the outlet header section 22 which extends from the right side wall 6 toward the left side wall 7 and whose length is 20% that of the outlet header section 22, the entire front side wall 9 is skewed rearward in a direction from the side toward the left side wall 7 to the side toward the right side wall 6.

In the liquid-cooled-type cooling device 1, water was supplied into the inlet header section 21 from the cooling-liquid inlet 11 through the inflow end portion 21a at a rate of 10 liters per minute. On the basis of flow velocities of water flowing through all the flow channels 18 of the parallel-flow-channel section 19, there were obtained the average flow velocity of all the flow channels 18 and the ratio of the flow velocity of water flowing through each flow channel 18 to the average flow velocity (flow velocity ratio=flow velocity/average flow velocity). By use of the obtained data, there was studied the relation between positions in the parallel-flow-channel section 19 along the width direction (left-right direction) and flow velocity ratios of the flow channels 18 corresponding to the positions (ratios of flow velocities of water flowing through the flow channels 18 to the average flow velocity).

Comparative Experiment Example 2

There was prepared a liquid-cooled-type cooling device having a configuration similar to that of the liquid-cooled-type cooling device 1 of Embodiment 1 except that the inlet header section and the outlet header section were uniform in front-rear width along the entire length thereof. The liquid-cooled-type cooling device has an a/b ratio of 0.07 on the condition that the inlet header section, the outlet header section, and the parallel-flow-channel section have a height of 6 mm, an inflow end portion of the inlet header section; i.e., the inlet header section, and the outlet header section have a width of a mm, and the parallel-flow-channel section has a width of b mm.

In the liquid-cooled-type cooling device, water was supplied into the inlet header section from the cooling-liquid inlet at a rate of 10 liters per minute. On the basis of flow velocities of water flowing through all the flow channels of the parallel-flow-channel section, there were obtained the average flow velocity of all the flow channels and the ratio of the flow velocity of water flowing through each flow channel to the average flow velocity (flow velocity ratio=flow velocity/average flow velocity). By use of the obtained data, there was studied the relation between positions in the parallel-flow-channel section along the width direction (left-right direction) and flow velocity ratios of the flow channels corresponding to the positions (ratios of flow velocities of water flowing through the flow channels to the average flow velocity).

The results of the study are shown in FIG. 6. As is apparent from FIG. 6, in the liquid-cooled-type cooling device 1 of Embodiment 1 used in Experiment Example 2, the flow velocity of water flowing through the flow channel 18 is small in deviation from the average flow velocity at every position along the width direction of the parallel-flow-channel section 19. This indicates that the distribution of flow velocities of water flowing through all the flow channels 18 is uniform.

By contrast, in the case of the liquid-cooled-type cooling device which was used in Comparative Experiment Example 2 and in which the inlet header section and the outlet header section were uniform in width along the entire length thereof, at rightward positions; i.e., at positions located toward the cooling-liquid inlet, the velocities of water flowing through the flow channels are small in deviation from the average flow velocity, whereas, at leftward positions; i.e., at positions locate toward the cooling-liquid outlet, the velocities of water flowing through the flow channels are significantly large in deviation from the average flow velocity. This indicates that the distribution of flow velocities of water flowing through all the flow channels is nonuniform.

Embodiment 2

The present embodiment is shown in FIG. 7.

In the casing 2 of a liquid-cooled-type cooling device 30 shown in FIG. 7, the entire front side wall 9; specifically, the inner surface of the front side wall 9, is perpendicular to the inner surfaces of the right and left side walls 6 and 7 along the entire length of the front side wall 9. As a result, the cross-sectional area of an outlet header section 31 is uniform along the entire length of the outlet header section 31, and the width of the outlet header section 31 as measured in the front-rear direction is uniform along the entire length of the outlet header section 31. Also, the shape of the outlet header section 31 is not symmetrical with that of the inlet header section 21 with respect to the left-right direction (the direction of width of the parallel-flow-channel section 19).

Other configurational features are similar to those of the liquid-cooled-type cooling device 1 of Embodiment 1, and like components or sections are denoted by like reference numerals.

In the liquid-cooled-type cooling device 30 of Embodiment 2, the inflow end portion 21a of the inlet header section 21 which communicates with the cooling-liquid inlet 11 and is located on the side toward the right side wall 6 has a rectangular cross section, and also the outlet header section 31 has a rectangular cross section. The inflow end portion 21a of the inlet header section 21 and the outlet header section 31 have the same width in the front-rear direction. Also, the parallel-flow-channel section 19 has a rectangular cross section. Preferably, the relation a/b≤0.15 is satisfied on the condition that the inflow end portion 21a of the inlet header section 21 has a width of a mm, the outlet header section 31 has a width of a mm, the parallel-flow-channel section 19 has a width in the left-right direction of b mm, and the inlet header section 21, the outlet header section 31, and the parallel-flow-channel section 19 have a height of 6 mm or less.

Also, preferably, a cross-sectional area A of the inflow end portion 21a of the inlet header section 21 as expressed by a×h and a cross-sectional area B of the parallel-flow-channel section 19 as expressed by b×h satisfy the relation A/B≤0.15 on the condition that the inflow end portion 21a of the inlet header section 21 has a height of h mm and a width of a mm, and the parallel-flow-channel section 19 has a height of h mm and a width of b mm.

In the two embodiments described above, the cooling-liquid inlet 11 opens rightward, and the cooling-liquid outlet 12 opens leftward. However, the present invention is not limited thereto. For example, the cooling-liquid inlet and outlet 11 and 12 may open upward. In other words, the cooling-liquid inlet 11 and the cooling-liquid outlet 12 may be closed, and openings may be formed on the top wall at positions corresponding to the cooling-liquid inlet and outlet 11 and 12.

INDUSTRIAL APPLICABILITY

The liquid-cooled-type cooling device of the present invention is applied to, for example, a semiconductor power converter of a vehicle for cooling a heat-generating body, such as a semiconductor device.

Figure 1:
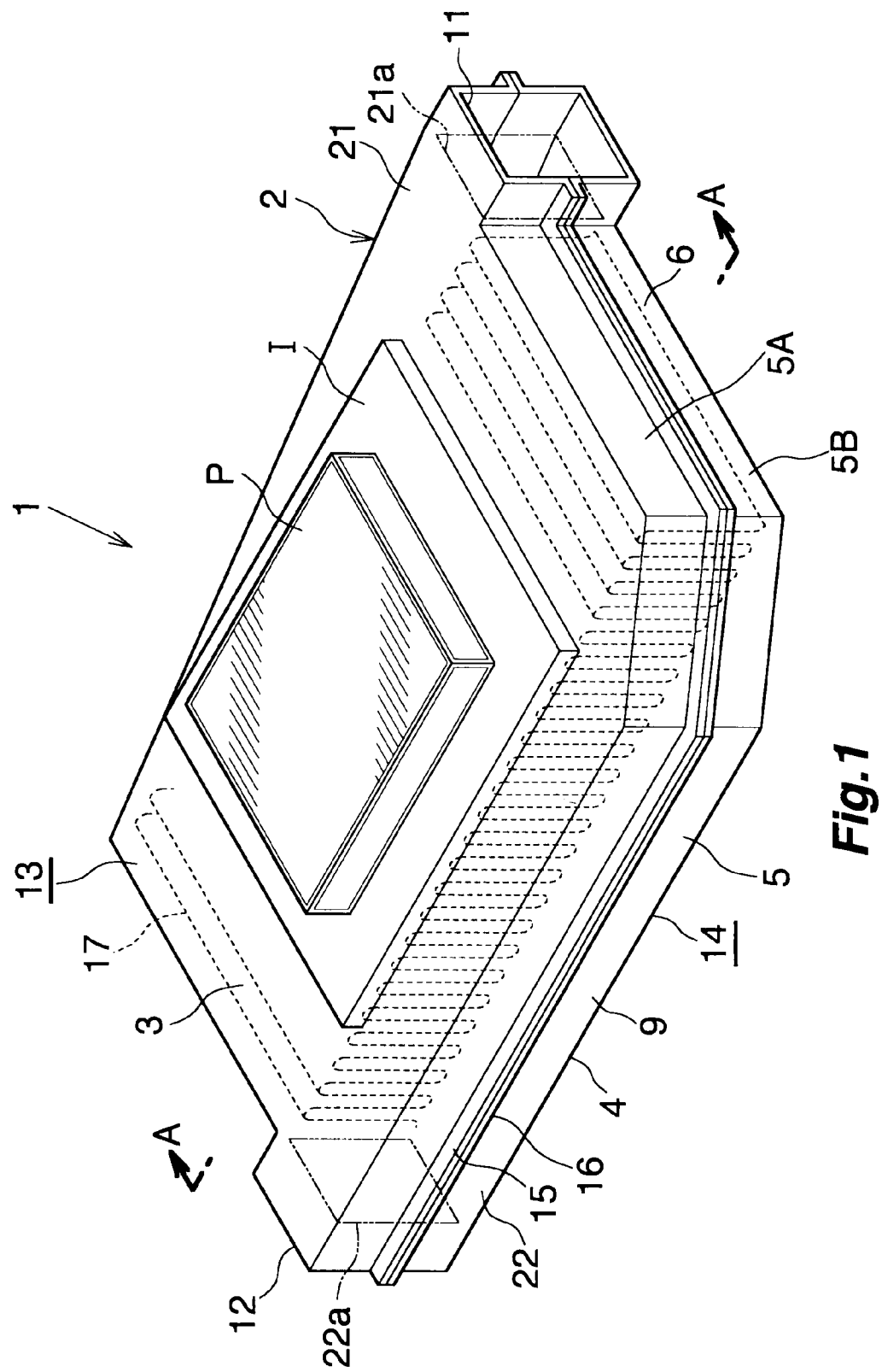
FIG. 1 is a perspective view showing a liquid-cooled-type cooling device according to Embodiment 1 of the present invention.
Figure 2:
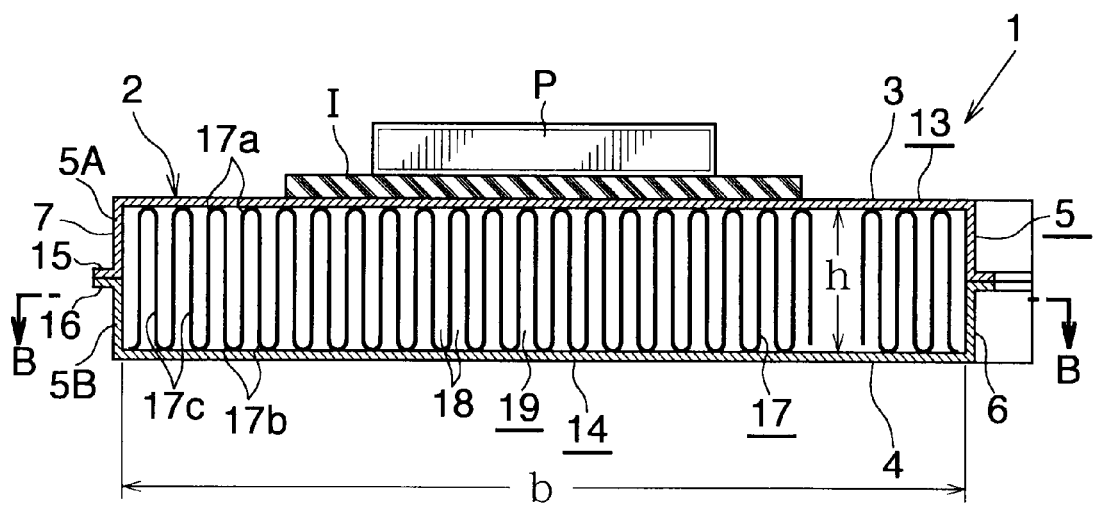
FIG. 2 is a sectional view taken along line A-A of FIG. 1.
Figure 3:
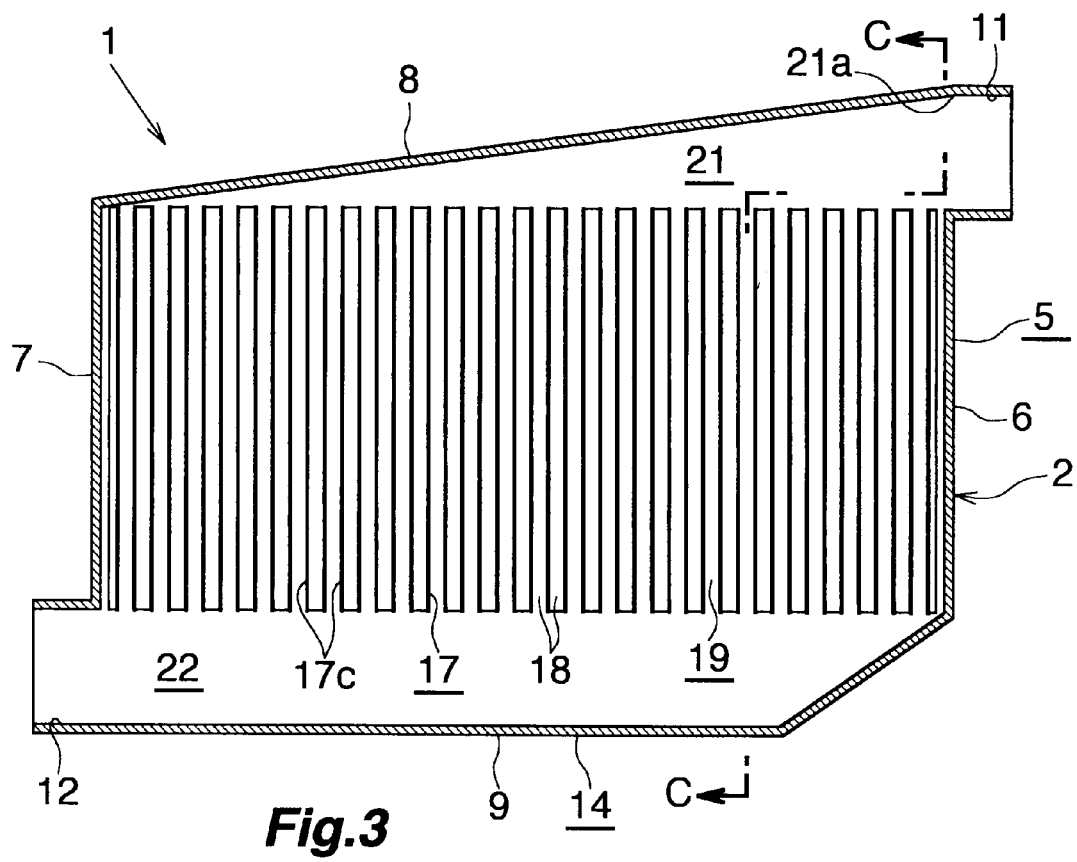
FIG. 3 is a sectional view taken along line B-B of FIG. 2.
Figure 4:
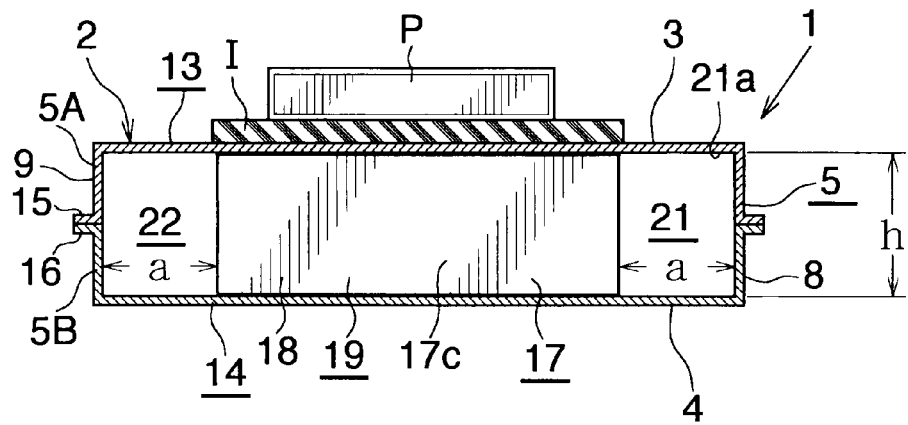
FIG. 4 is a sectional view taken along line C-C of FIG. 3.
Figure 5:
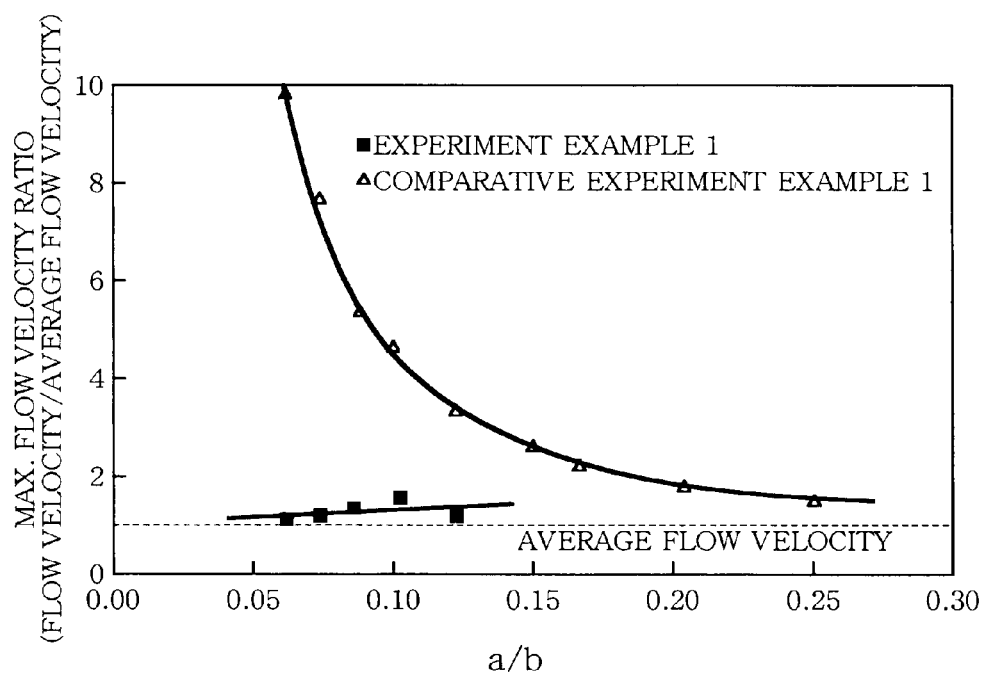
FIG. 5 is a graph showing the results of Experiment Example 1 and Comparative Experiment Example 1.
Figure 6:
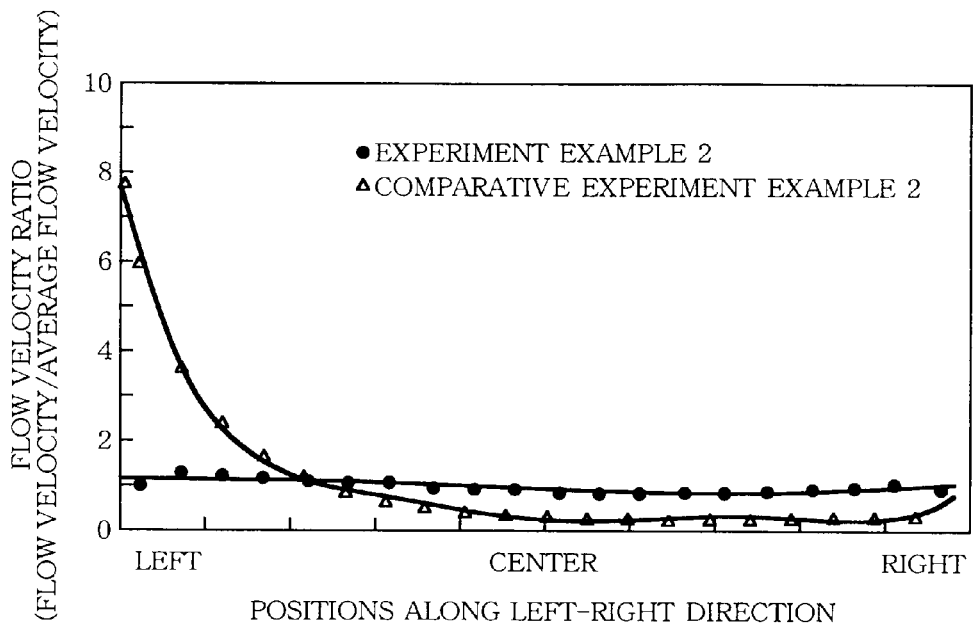
FIG. 6 is a graph showing the results of Experiment Example 2 and Comparative Experiment Example 2.
Figure 7:
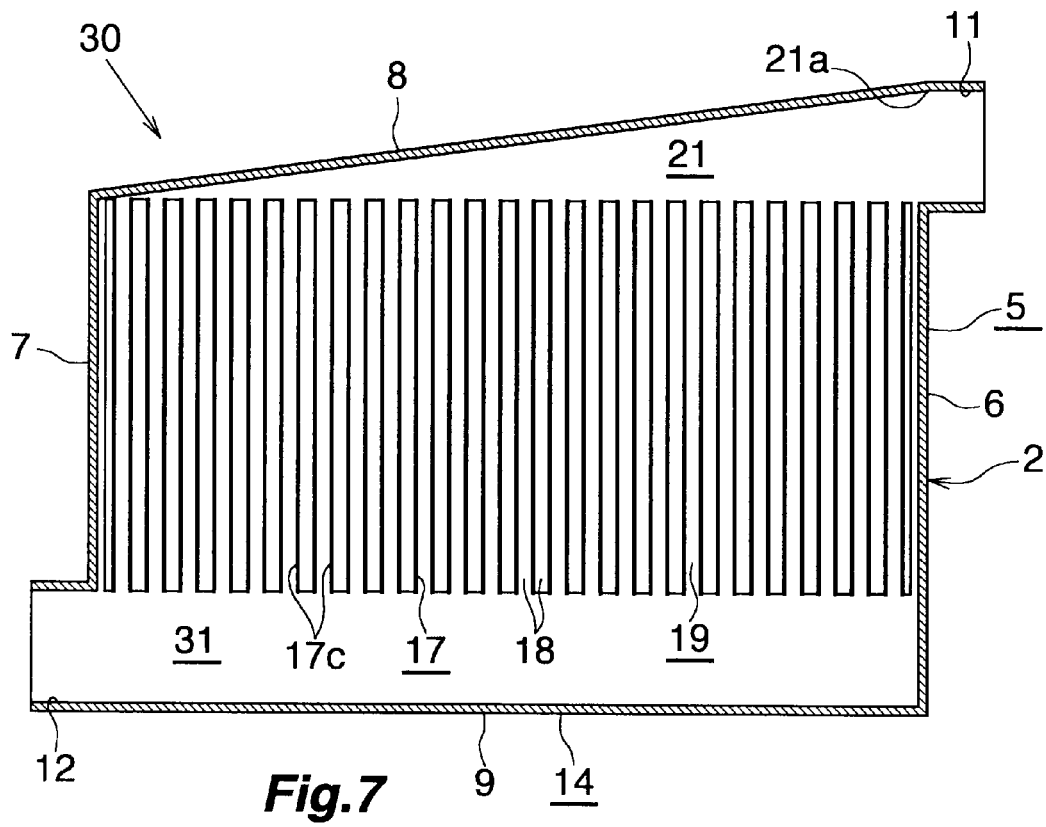
FIG. 7 is a view, equivalent to FIG. 3, showing a liquid-cooled-type cooling device according to Embodiment 2 of the present invention.

The invention claimed is:
1. A liquid-cooled-type cooling device having a casing comprising:
a peripheral wall including a first side wall and a second side wall positioned in opposition to each other, a cooling-liquid inlet being formed at one end portion of the first side wall, and a cooling-liquid outlet being formed at an end portion of the second side wall corresponding to the other end portion of the first side wall;
a parallel-flow-channel section provided in an internal region located between the first side wall and the second side wall and between the cooling-liquid inlet and the cooling-liquid outlet, the parallel flow channel section including a plurality of flow channels through which cooling liquid flows in a longitudinal direction of the first and second side walls, the first and second side walls defining a width of the parallel-flow-channel section;
an internal region located upstream of the parallel-flow-channel section and which serves as an inlet header section communicating with the cooling-liquid inlet; and
an internal region located downstream of the parallel-flow-channel section and which serves as an outlet header section communicating with the cooling-liquid outlet,
wherein a length of the inlet header section corresponds to the width of the parallel-flow-channel section, and a cross-sectional flow-channel area of the inlet header section reduces in a direction from the cooling-liquid inlet side toward the second side wall along an entire length thereof, and
a length of the outlet header section corresponds to the width of the parallel-flow-channel section, and a shape of the outlet header section is not symmetrical with a shape of the inlet header section along their respective lengths, and
a portion of the outlet header section extends from the first side wall and reduces in cross-sectional flow-channel area in a direction from the second side wall toward the first side wall, the portion of the outlet header section being 20% or less than said length of the outlet header section, and a remaining portion of the outlet header section is uniform in cross-sectional flow-channel area along an entire length of the remaining portion.

2. A liquid-cooled-type cooling device according to claim 1, wherein the inlet header section, the outlet header section, and the parallel-flow-channel section have the same height.

3. A liquid-cooled-type cooling device according to claim 2, wherein the peripheral wall of the casing further includes a third side wall connecting an end portion of the first side wall located on a side toward the cooling-liquid inlet and an end portion of the second side wall located on the side toward the cooling-liquid inlet, and a fourth side wall connecting an end portion of the first side wall located on a side toward the cooling-liquid outlet and an end portion of the second side wall located on the side toward the cooling-liquid outlet, and an inner surface of the third side wall is skewed toward the parallel-flow-channel section in a direction from the side toward the first side wall to the side toward the second side wall.

4. A liquid-cooled-type cooling device according to claim 3, wherein in the portion of the outlet header section which portion extends from the first side wall, an inner surface of the fourth side wall is skewed toward the parallel-flow-channel section in a direction from the side toward the second side wall to the side toward the first side wall, and in the remaining portion of the outlet header section, an inner surface of the fourth side wall is perpendicular to inner surfaces of the first and second side walls.

5. A liquid-cooled-type cooling device according to claim 3, wherein a relation a/b≤0.15 is satisfied on the condition that the inflow end portion of the inlet header section has a width of a mm, the portion of the outlet header section in which the inner surface of the fourth side wall is perpendicular to the inner surfaces of the first and second side walls has a width of a mm, the parallel-flow-channel section has a width of b mm, and the inlet header section, the outlet header section, and the parallel-flow-channel section have a height of 6 mm or less.

6. A liquid-cooled-type cooling device according to claim 1, wherein the outlet header section is uniform in cross-sectional flow-channel area along the entire length of the outlet header section.

7. A liquid-cooled-type cooling device according to claim 6, wherein the inlet header section, the outlet header section, and the parallel-flow-channel section have the same height, and the outlet header section is uniform in width along the entire length of the outlet header section.

8. A liquid-cooled-type cooling device according to claim 7, wherein the peripheral wall of the casing further includes a third side wall connecting an end portion of the first side wall located on a side toward the cooling-liquid inlet and an end portion of the second side wall located on the side toward the cooling-liquid inlet, and a fourth side wall connecting an end portion of the first side wall located on a side toward the cooling-liquid outlet and an end portion of the second side wall located on the side toward the cooling-liquid outlet, and an inner surface of the third side wall is skewed toward the parallel-flow-channel section in a direction from the side toward the first side wall to the side toward the second side wall.

9. A liquid-cooled-type cooling device according to claim 6, wherein a relation a/b≤0.15 is satisfied on the condition that the inflow end portion of the inlet header section has a width of a mm, the outlet header section has a width of a mm, the parallel-flow-channel section has a width of b mm, and the inlet header section, the outlet header section, and the parallel-flow-channel section have a height of 6 mm or less.

10. A liquid-cooled-type cooling device according to claim 6 wherein a cross-sectional area A of the inflow end portion of the inlet header section as expressed by a×h and a cross-sectional area B of the parallel-flow-channel section as expressed by b×h satisfy a relation A/B≤0.15 on the condition that the inflow end portion of the inlet header section has a height of h mm and a width of a mm, and the parallel-flow-channel section has a height of h mm and a width of b mm.

11. A liquid-cooled-type cooling device comprising:

a casing including a bottom wall, a first side wall vertically extending from the bottom wall, a second side wall vertically extending from the bottom wall and facing the first side wall, a top wall facing the bottom wall and connected to the first and second side walls, a third side wall which connects the bottom wall and the top wall and having one end is connected to one end of the second side wall, a fourth side wall which connects the bottom wall and the top wall and having one end connected to one end of the first side wall, a cooling-liquid inlet which connects the other end of the first side wall and the other end of the third side wall, and a cooling-liquid outlet which connects the other end of the second side wall and the other end of the fourth side wall, wherein the third side wall and the fourth side wall differ in shape; and a parallel-flow-channel section provided within the casing and including a plurality of flow channels through which cooling liquid flows in a longitudinal direction of the first and second side walls, the first and second side walls defining a width of the parallel-flow-channel section, wherein a length of the third side wall and a length of the fourth side wall each corresponds to said width of the parallel-flow-channel section, and the shape of the third side wall differs from that of the fourth side wall along their respective lengths, and a portion of the fourth side wall extending from the first side wall and which is 20% or less than said length of said fourth side wall is skewed toward the parallel-flow-channel section in a direction from the second side wall toward the first side wall, and a remaining portion of the fourth side wall forms a right angle with the first and second side walls.

12. A liquid-cooled-type cooling device according to claim 6, wherein a cross-sectional area A of the inflow end portion of the inlet header section as expressed by a×h and a cross-sectional area B of the parallel-flow-channel section as expressed by b×h satisfy a relation A/B≤0.15 on the condition that the inflow end portion of the inlet header section has a height of h mm and a width of a mm, and the parallel-flow-channel section has a height of h mm and a width of b mm.

* * * * *